(12) United States Patent
Park et al.

(10) Patent No.: US 12,177,324 B2
(45) Date of Patent: *Dec. 24, 2024

(54) ELECTRONIC DEVICE AND OPERATING METHOD OF A DECODER

(71) Applicant: SAMSUNG ELECTRONICS CO., LTD., Suwon-si (KR)

(72) Inventors: Yong-Yun Park, Seoul (KR); Kyungho Ryu, Hwaseong-si (KR); Kilhoon Lee, Seoul (KR); Hyunwook Lim, Seoul (KR); Youngmin Choi, Yongin-si (KR); Kyungae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/244,107

(22) Filed: Sep. 8, 2023

(65) Prior Publication Data

US 2023/0421671 A1    Dec. 28, 2023

Related U.S. Application Data

(63) Continuation of application No. 17/679,412, filed on Feb. 24, 2022, now Pat. No. 11,758,030.

(30) Foreign Application Priority Data

Jun. 17, 2021    (KR) .......................... 10-2021-0078825

(51) Int. Cl.
*H04L 69/324*    (2022.01)
*H04L 47/43*    (2022.01)

(52) U.S. Cl.
CPC ............ *H04L 69/324* (2013.01); *H04L 47/43* (2022.05)

(58) Field of Classification Search
CPC ... H04L 69/322; H04L 69/324; H04L 1/0041; H04L 1/0042; H04L 1/0083;
(Continued)

(56) References Cited

U.S. PATENT DOCUMENTS 6,175,388 B1    1/2001    Knox et al.
10,170,033 B2    1/2019    Yoo et al.
(Continued)

FOREIGN PATENT DOCUMENTS

CN    108702358 A    10/2018
KR    10-0324765 B1    2/2002
(Continued)

*Primary Examiner* — Warner Wong
(74) *Attorney, Agent, or Firm* — Muir Patent Law, PLLC

(57) ABSTRACT

Disclosed is an operating method of an encoder, which includes receiving a first bit stream including first to N-th bits, determining at least one symbol in the first bit stream, wherein the at least one symbol includes "M" consecutive bits each having the first bit value or the second bit value, and generating a first data packet including a first header and at least one packet symbol. The first header includes a least symbol address of a first symbol of the at least one symbol and an inverted value of a bit value of the first bit, a first packet symbol of the at least one packet symbol includes a bit value of the first symbol, a least symbol address of a second symbol of the at least one symbol, and an inverted value of a bit value of a next bit of the first symbol.

20 Claims, 17 Drawing Sheets

(58) Field of Classification Search
CPC ..... H04L 1/0084; H04L 1/009; H04L 1/0091; H04L 12/40071; H04L 69/22; H04L 47/43
See application file for complete search history.

(56) References Cited

U.S. PATENT DOCUMENTS

| | | |
|---|---|---|
| 10,249,258 B2 | 4/2019 | Park et al. |
| 2005/0108610 A1* | 5/2005 | Kim ..................... H04L 5/023 714/748 |
| 2009/0303869 A1 | 12/2009 | Umari et al. |
| 2015/0193905 A1 | 7/2015 | Lee et al. |
| 2017/0077956 A1 | 3/2017 | Hamada |
| 2022/0103190 A1 | 3/2022 | Kim et al. |

FOREIGN PATENT DOCUMENTS

| | | |
|---|---|---|
| KR | 10-2019-0053066 A | 5/2019 |
| TW | 2009 35808 | 8/2009 |

* cited by examiner

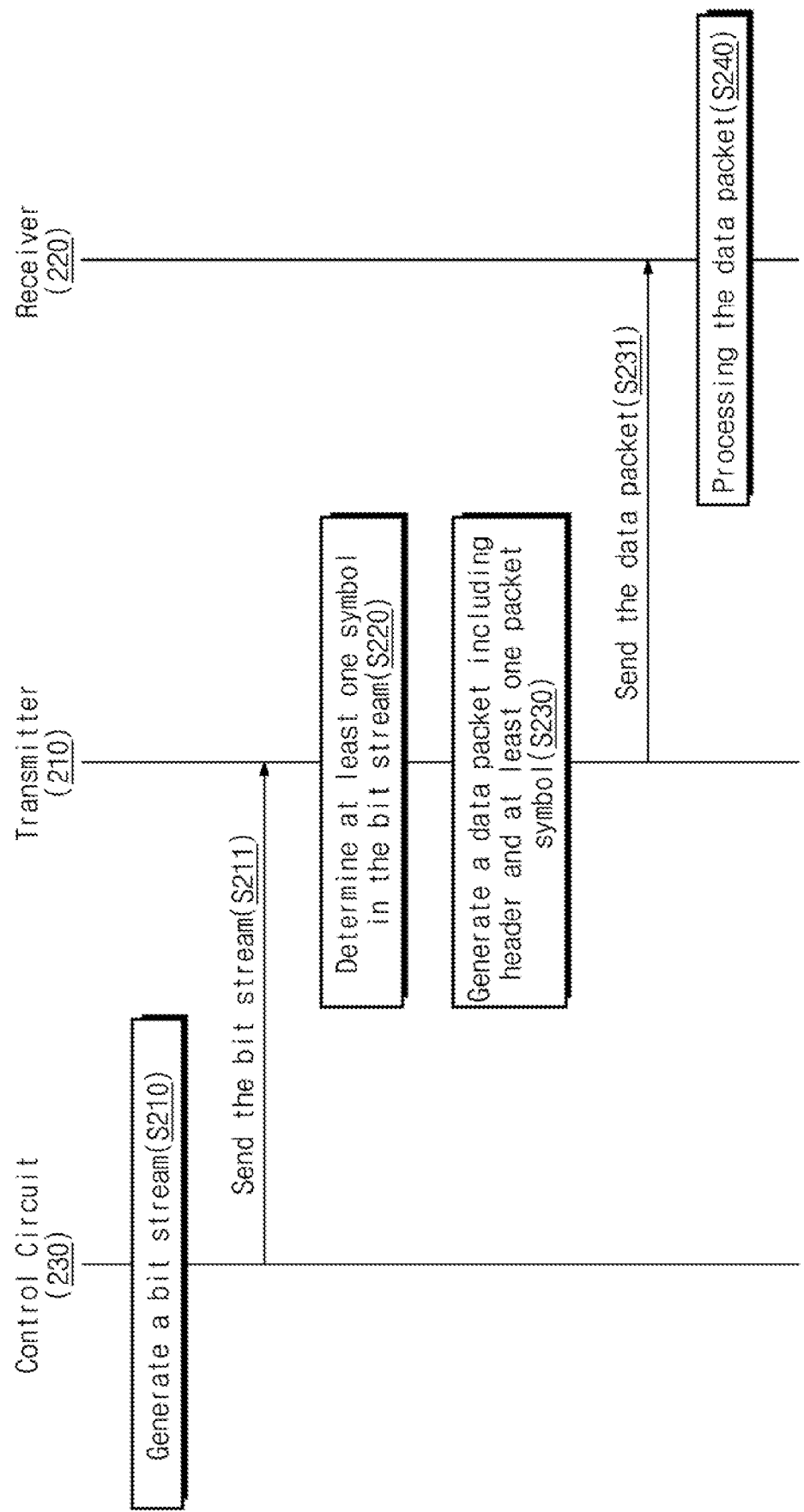

ELECTRONIC DEVICE AND OPERATING METHOD OF A DECODER

CROSS-REFERENCE TO RELATED APPLICATIONS

This is a continuation application based on pending application Ser. No. 17/679,412, filed Feb. 24, 2022, the entire contents of which is hereby incorporated by reference.

This application claims priority under 35 U.S.C. § 119 to Korean Patent Application No. 10-2021-0078825, filed Jun. 17, 2021, in the Korean Intellectual Property Office, the disclosure of which is incorporated by reference herein in its entirety.

BACKGROUND

1. Field

Embodiments relate to an encoder, and more particularly, relate to an encoder generating a data packet, an operating method of the encoder, and an operating method of an electronic device including the encoder.

2. Description of the Related Art

A transmitter may transmit a signal to a receiver in compliance with an interface protocol, and the receiver may obtain data corresponding to the received signal by processing the received signal. To operate in response to a clock, the receiver may extract or recover the clock from the signal received from the transmitter, and for this the receiver may include a clock-data recovery circuit. The receiver may recover data corresponding to the received signal in response to the clock extracted or recovered by the clock-data recovery circuit. For a stable operation of the clock-data recovery circuit, a signal received from the transmitter may be encoded. Also, a signal received from the transmitter may be encoded so as to correspond to a transmission unit of the interface protocol between a transmitting device and a receiving device.

SUMMARY

According to an embodiment, an operating method of an encoder includes receiving a first bit stream including first to N-th bits each having a first bit value or a second bit value, determining at least one symbol in the first bit stream, wherein the at least one symbol includes "M" consecutive bits each having the first bit value or the second bit value, and generating a first data packet including a first header and at least one packet symbol corresponding to the at least one symbol, based on the at least one symbol. The first header includes a least symbol address of a first symbol of the at least one symbol and an inverted value of a bit value of the first bit, a first packet symbol of the at least one packet symbol includes a bit value of the first symbol, a least symbol address of a second symbol of the at least one symbol, and an inverted value of a bit value of a next bit of the first symbol, and the "N" is a natural number, and "M" is a natural number smaller than the "N".

According to an embodiment, an operating method of an electronic device which includes a control circuit, a transmitter, and a receiver includes generating, by the control circuit, a first bit stream including first to N-th bits each having a first bit value or a second bit value, determining, by the transmitter, at least one symbol in the first bit stream, wherein the at least one symbol includes "M" consecutive bits each having the first bit value or the second bit value, generating, by the transmitter, a first data packet including a first header and at least one packet symbol corresponding to the at least one symbol, based on the at least one symbol, and processing, by the receiver, the first data packet. The first header includes a least symbol address of a first symbol of the at least one symbol and an inverted value of a bit value of the first bit, a first packet symbol of the at least one packet symbol includes a bit value of the first symbol, a least symbol address of a second symbol of the at least one symbol, and an inverted value of a bit value of a next bit of the first symbol, and the "N" is a natural number, and the "M" is a natural number smaller than the "N".

According to an embodiment, an electronic device includes a control circuit that receives a bit stream including first to N-th bits each having a first bit value or a second bit value, a transmitter that determines at least one symbol in the bit stream and to generate a first data packet including a first header and at least one packet symbol corresponding to the at least one symbol, based on the at least one symbol, and a receiver that processes the first data packet. The at least one symbol includes "M" consecutive bits each having the first bit value or the second bit value, the first header includes a least symbol address of a first symbol of the at least one symbol and an inverted value of a bit value of the first bit, a first packet symbol of the at least one packet symbol includes a bit value of the first symbol, a least symbol address of a second symbol of the at least one symbol, and an inverted value of a bit value of a next bit of the first symbol, and the "N" is a natural number, and the "M" is a natural number smaller than the "N".

BRIEF DESCRIPTION OF THE DRAWINGS

Features will become apparent to those of skill in the art by describing in detail example embodiments with reference to the attached drawings in which:

FIG. 12 is a flowchart illustrating an operating method of an electronic device, according to an example embodiment.

DETAILED DESCRIPTION

Figure 1:
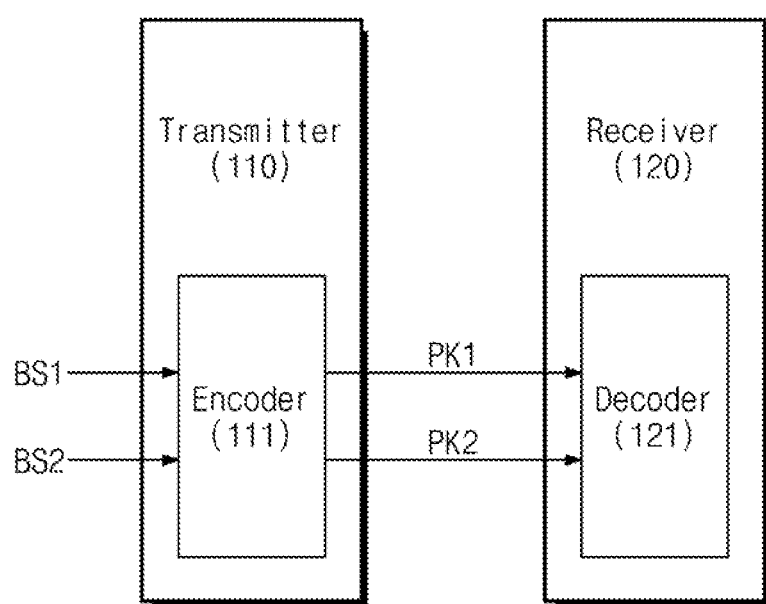
FIG. 1 is a block diagram of an electronic device, according to an example embodiment.

FIG. 1 is a block diagram illustrating an electronic device 100, according to an example embodiment.

Referring to FIG. 1, the electronic device 100 according to an example embodiment may include a transmitter 110 and a receiver 120. The electronic device 100 may be an electronic device such as a tablet computer, a smartphone, a television (TV), etc.

The electronic device 100 may encode an interval in which the same bit value occurs in many consecutive data elements. The electronic device 100 may restrict a run length of data. The run length may refer to a length of an interval in which the same bit value occurs in many consecutive data elements.

The electronic device 100 may perform encoding such that a maximum run length of data is smaller than or equal to a length that a user decides.

The transmitter 110 may receive a first bit stream BS1 and a second bit stream BS2. The transmitter 110 may receive the first bit stream BS1, and may then receive the second bit stream BS2.

Each of the first bit stream BS1 and the second bit stream BS2 may include first to "N" bits each having a first bit value or a second bit value. The first bit value and the second bit value may be different from each other, and "N" may be an arbitrary natural number. For example, the first bit value may be "0", the second bit value may be "1", "N" may be "510," and each of the first bit stream BS1 and the second bit stream BS2 may include first to $510^{th}$ bits. The value of "N" may be increased or decreased in other examples.

The transmitter 110 may include an encoder 111. The encoder 111 may determine at least one symbol in the first bit stream BS1 and the second bit stream BS2.

A symbol may refer to "M" consecutive bits each having the first bit value or the second bit value. "M" may be an arbitrary natural number, and "N" may be a multiple of "M."

As an example, in the case where "M" is "10" and all bit values of first to tenth bits of the first bit stream BS1 are "0", the encoder 111 may determine the first to tenth bits as one symbol. Thus, the encoder 111 may perform encoding such that a maximum run length of the first bit stream BS1 is smaller than "M" or is equal to "M". The value of "M" may be increased or decreased in other examples.

In various examples, each of the first bit stream BS1 and the second bit stream BS2 may include a plurality of symbols, or each of the first bit stream BS1 and the second bit stream BS2 may not include a symbol.

An example of how the encoder 111 may determine a symbol in the first bit stream BS1 and the second bit stream BS2 will be described in more detail with reference to FIG. 6.

The encoder 111 may generate a first data packet PK1 based on the first bit stream BS1, and may generate a second data packet PK2 based on the second bit stream BS2. The first data packet PK1 may include a first header and at least one packet symbol. The second data packet PK2 may include a second header and at least one packet symbol.

A maximum run length of each of the first data packet PK1 and the second data packet PK2 may be smaller than "M" or may be equal to "M". Thus, the encoder 111 may generate the first data packet PK1 whose maximum run length is equal to "M" or is smaller than "M", based on the first bit stream BS1 whose maximum run length is greater than "M".

The encoder 111 may replace a symbol of each of the first bit stream BS1 and the second bit stream BS2 with a packet symbol, and thus may perform encoding such that a maximum run length of the first data packet PK1 and the second data packet PK2 is equal to "M" or is smaller than "M".

An example of how the encoder 111 may generate a data packet based on a bit stream will be described in more detail with reference to FIG. 3.

The receiver 120 may receive the first data packet PK1 and the second data packet PK2. A decoder 121 of the receiver 120 may generate the first bit stream BS1 based on the first data packet PK1. The decoder 121 may generate the second bit stream BS2 based on the second data packet PK2.

When a maximum run length of the first data packet PK1 and the second data packet PK2 is greater than "M", the decoder 121 may determine that an error occurs in an encoding operation of the encoder 111.

Figure 2:
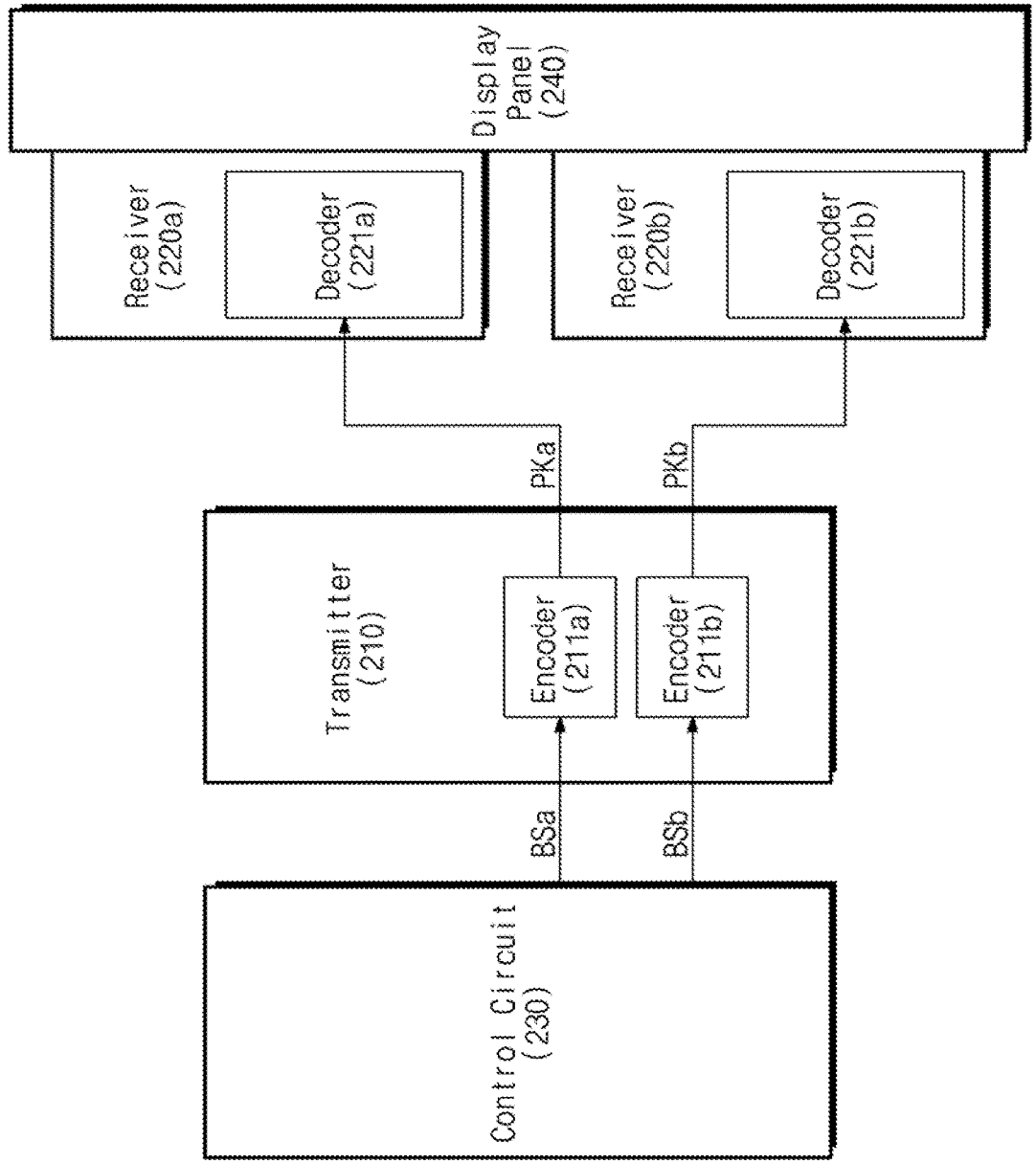
FIG. 2 is a block diagram of an electronic device, according to an example embodiment.

FIG. 2 illustrates a block diagram of an electronic device, according to an example embodiment.

Referring to FIG. 2, an electronic device 200 according to an example embodiment may include a control circuit 230, a transmitter 210, a first receiver 220a, a second receiver 220b, and a display panel 240. The electronic device 200 may be, e.g., a display device.

The transmitter 210 of FIG. 2 may correspond to the transmitter 110 of FIG. 1, and the first receiver 220a and the second receiver 220b of FIG. 2 may correspond to the receiver 120 of FIG. 1.

The electronic device 200 may encode an interval in which the same bit value occurs in many consecutive data elements.

The control circuit 230 may generate a first bit stream BSa and a second bit stream BSb. The first bit stream BSa and the second bit stream BSb may include image data to be output to the display panel 240.

The control circuit 230 may simultaneously generate the first bit stream BSa and the second bit stream BSb. The first bit stream BSa and the second bit stream BSb may include the same data.

Each of the first bit stream BSa and the second bit stream BSb may include first to N-bit bits each having a first bit value or a second bit value.

The transmitter 210 may be a semiconductor device for display. The transmitter 210 may be a timing controller that is mounted in a medium or large size panel for an LCD mode or a TV to adjust the amount of data to be transmitted and to improve an image quality.

The transmitter 210 may output the first data packet PKa to the first receiver 220a. The transmitter 210 may output the second data packet PKb to the second receiver 220b.

The transmitter 210 may include a first encoder 211a and a second encoder 211b. The first encoder 211a may generate the first data packet PKa based on the first bit stream BSa. The second encoder 211b may generate the second data packet PKb based on the second bit stream BSb.

The first receiver 220a may receive the first data packet PKa. The first receiver 220a may include a first decoder 221a.

The first decoder 221a may process the first data packet PKa. The first decoder 221a may generate the first bit stream BSa from the first data packet PKa. The first decoder 221a may recover a clock from the first data packet PKa.

The second receiver 220b may receive the second data packet PKb. The second receiver 220b may include a second decoder 221b.

The second decoder 221b may process the second data packet PKb. The second decoder 221b may generate the second bit stream BSb from the second data packet PKb. The second decoder 221b may recover a clock from the second data packet PKb.

The display panel 240 may be a device capable of outputting image data, and may be implemented with various display panels such as an organic light emitting diode (OLED) panel and a liquid crystal panel. The display panel 240 may output the first bit stream BSa and the second bit stream BSb respectively generated by the first decoder 221a and the second decoder 221b.

Figure 3:
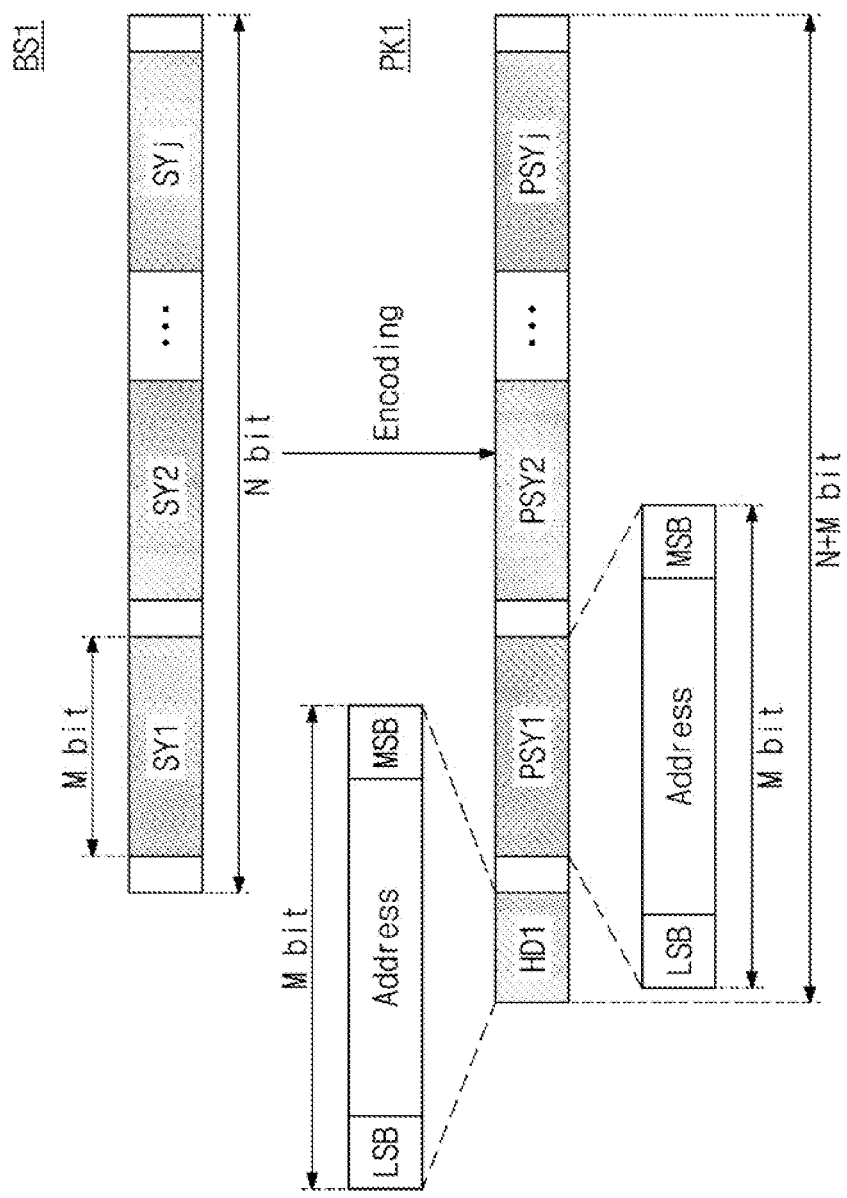
FIG. 3 is a diagram illustrating a data packet in detail, according to an example embodiment.

FIG. 3 is a diagram illustrating a data packet, according to an example embodiment.

Referring to FIGS. 1 and 3, an operation in which the encoder 111 generates the first data packet PK1 based on the first bit stream BS1 is illustrated.

The encoder 111 may generate the first data packet PK1 based on the first bit stream BS1. The encoder 111 may generate the first data packet PK1 including a first header HD1 and a plurality of packet symbols PSY1 to PSYj, based on a plurality of symbols SY1 to SYj of the first bit stream BS1. Here, "j" may be an arbitrary natural number.

The first header HD1 may include "M" bits composed of first bit values and second bit values. Each of the plurality of packet symbols PSY1 to PSYj may include "M" bits composed of first bit values and second bit values.

The first bit stream BS1 may include "N" bits, and the first data packet PK1 may include "N" bits and "M" bits.

Because the encoder 111 generates the first data packet PK1 based on the first bit stream BS1, an overhead that is used for the encoder 111 to perform an encoding operation may be a value "M" divided by "N". For example, when "N" is 510 and "M" is 10, the first bit stream BS1 may include first to $510^{th}$ bits, and the first data packet PK1 may include first to $520^{th}$ bits. In this case, an overhead that is used for the encoder 111 to perform an encoding operation may be "0.0196" (i.e., 10/510).

The first header HD1 may include a least significant bit (LSB) field, an address field, and a most significant bit (MSB) field.

The LSB field and the MSB field of the first header HD1 may be fields that allow a maximum run length of the first data packet PK1 to be "M" or less.

The address field of the first header HD1 may include information of a symbol address of the first symbol SY1. The first header HD1 may be located at the forefront of the first data packet PK1. The first header HD1 will be described in more detail with reference to FIG. 4A.

The plurality of packet symbols PSY1 to PSYj of the first data packet PK1 may correspond to the plurality of symbols SY1 to SYj of the first bit stream BS1, respectively. Each of the plurality of packet symbols PSY1 to PSYj may include information of the corresponding symbol of the plurality of symbols SY1 to SYj.

A size of each of the plurality of packet symbols PSY1 to PSYj may be equal to a size of each of the plurality of symbols SY1 to SYj. The encoder 111 may replace the symbols SY1 to SYj whose run length is greater than "M", with the plurality of packet symbols PSY1 to PSYj whose run length is "M" or less.

Each of the plurality of packet symbols PSY1 to PSYj may include an LSB field, an address field, and an MSB field.

The LSB field of the first packet symbol PSY1 may include information of the first symbol SY1.

The address field of the first packet symbol PSY1 may include address information of the second symbol SY2.

The MSB field of the first packet symbol PSY1 may be a field that allows a maximum run length of the first data packet PK1 to be "M" or less.

The plurality of packet symbols PSY1 to PSYj will be described in more detail with reference to FIG. 4B.

For convenience of description, FIG. 3 shows an operation in which the encoder 111 generates the first data packet PK1 based on the first bit stream BS1; however, as in the example illustrated in FIG. 3, the encoder 111 may generate the second data packet PK2 based on the second bit stream BS2.

Figure 4A:
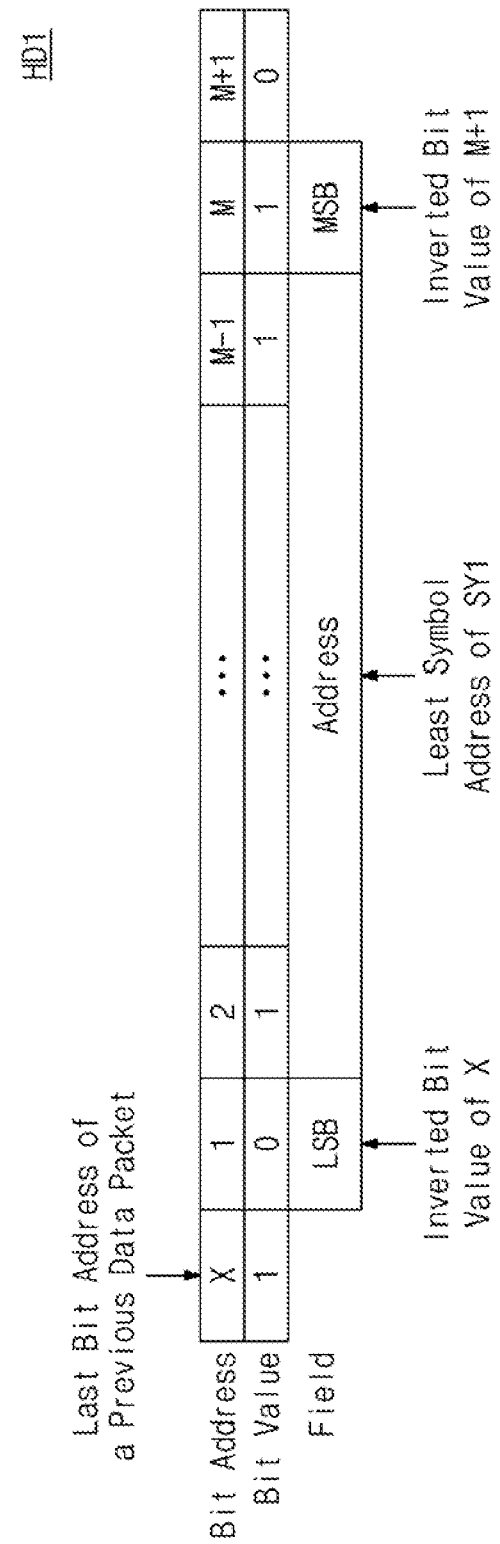
FIG. 4A is a diagram illustrating a header in detail, according to an example embodiment.

FIG. 4A is a diagram illustrating a header in detail, according to an example embodiment.

Referring to FIGS. 3 and 4A, the LSB field, the address field, and the MSB field of the first header HD1 are illustrated.

The first header HD1 may include first to M-th bits.

The LSB field of the first header HD1 may correspond to a bit, the bit address of which is the smallest, from among the first to M-th bits.

The MSB field of the first header HD1 may correspond to a bit, the bit address of which is the greatest, from among the first to M-th bits.

The address field of the first header HD1 may correspond to the remaining bits of the first to M-th bits other than the bits belonging to the LSB and MSB fields.

For example, the LSB field of the first header HD1 may correspond to bit address "1", the MSB field of the first header HD1 may correspond to bit address "M", and the address field of the first header HD1 may correspond to bit addresses "2:M−1".

The LSB field of the first header HD1 may include an inverted value of a bit value of bit address "X". A bit of bit address "X" may be the last bit of a previous bit stream (not illustrated). For example, in the case where a bit value of bit address "X" is "1", a bit value of the LSB field of the first header HD1 may be "0".

A decoder may compare a bit value of bit address "X" and a bit value of the LSB field of the first header HD1 to determine whether an error occurs in an operation of the encoder 111. For example, when the bit value of bit address "X" is equal to the bit value of the LSB field of the first header HD1, the decoder may determine that an error occurs in an operation of the encoder 111.

As the LSB field of the first header HD1 includes an inverted value of a bit value of bit address "X", the LSB field of the first header HD1 may be a field that allows a maximum run length of the first data packet PK1 to be "M" or less. When a maximum run length of the first data packet PK1 and the second data packet PK2 is greater than "M", the decoder may determine that an error occurs in an operation of the encoder 111.

The address field of the first header HD1 may include information of a least symbol address of the first symbol SY1.

The least symbol address may indicate a symbol address being the lowest from among a plurality of symbol addresses corresponding to one symbol. For example, in the case where the first symbol SY1 includes first to fifth symbol addresses, a value of the least symbol address may be "1".

In the case where a value of the least symbol address of the first symbol SY1 is "1", the address field of the first header HD1 may include "1".

The MSB field of the first header HD1 may include an inverted value of a bit value of bit address "M+1". For example, in the case where a bit value of bit address "M+1" is "0", a bit value of the MSB field of the first header HD1 may be "1". The MSB field of the first header HD1 may include an inverted value of a bit value of a first bit in the first bit stream BS1.

The decoder may compare a bit value of bit address "M+1" and a bit value of the MSB field of the first header HD1 to determine whether an error occurs in an operation of the encoder 111. For example, when the bit value of bit address "M+1" is equal to the bit value of the MSB field of the first header HD1, the decoder may determine that an error occurs in an operation of the encoder 111.

As the MSB field of the first header HD1 includes an inverted value of a bit value of bit address "M+1", the MSB field of the first header HD1 may be a field that allows a maximum run length of the first data packet PK1 to be "M" or less.

Figure 4B:
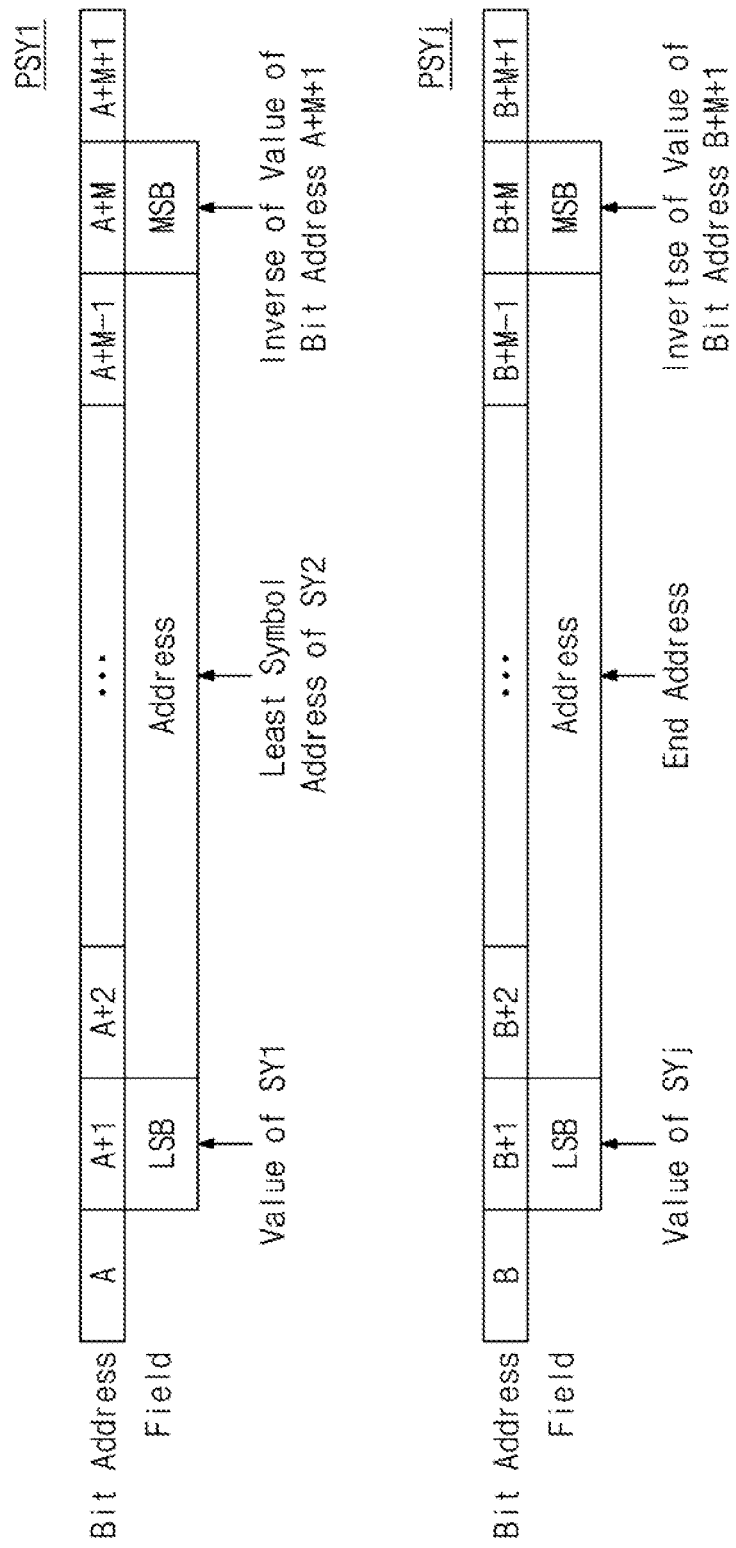
FIG. 4B is a diagram illustrating a packet symbol in detail, according to an example embodiment.

FIG. 4B is a diagram illustrating a header in detail, according to an example embodiment.

Referring to FIGS. 3 and 4B, the LSB field, the address field, and the MSB field of each of the first packet symbol PSY1 and the j-th packet symbol PSYj are illustrated.

Each of the first packet symbol PSY1 and the j-th packet symbol PSYj may include "M" bits composed of first bit values and second bit values. Each of the first packet symbol PSY1 and the j-th packet symbol PSYj may include the LSB field, the address field, and the MSB field.

The first packet symbol PSY1 may include (A+1)-th to (A+M)-th bits.

The LSB field of the first packet symbol PSY1 may correspond to a bit, the bit address of which is the smallest, from among the (A+1)-th to (A+M)-th bits.

The MSB field of the first packet symbol PSY1 may correspond to a bit, the bit address of which is the greatest, from among the (A+1)-th to (A+M)-th bits.

The address field of the first packet symbol PSY1 may correspond to the remaining bits of the (A+1)-th to (A+M)-th bits other than the bits belonging to the LSB and MSB fields.

For example, the LSB field of the first packet symbol PSY1 may correspond to bit address "A+1", the MSB field of the first packet symbol PSY1 may correspond to bit address "A+M", and the address field of the first packet symbol PSY1 may correspond to bit addresses "A+2:A+M−1".

The LSB field of the first packet symbol PSY1 may include a bit value of the first symbol SY1. For example, in the case where a bit value of the first symbol SY1 includes "M" bits each being "0", the LSB field of the first packet symbol PSY1 may include "0".

The address field of the first packet symbol PSY1 may include a least symbol address of the second symbol SY2. For example, in the case where a value of the least symbol address of the second symbol SY2 is "14", the address field of the first packet symbol PSY1 may include "14".

The MSB field of the first packet symbol PSY1 may include an inverted value of a bit value of bit address "A+M+1". For example, in the case where a bit value of bit address "A+M+1" is "0", a bit value of the MSB field of the first packet symbol PSY1 may be "1".

A decoder may compare a bit value of bit address "A+M+1" and a bit value of the MSB field of the first packet symbol PSY1 to determine whether an error occurs in an operation of the encoder 111. For example, when the bit value of bit address "A+M+1" is equal to the bit value of the MSB field of the first packet symbol PSY1, the decoder may determine that an error occurs in an operation of the encoder 111.

As the MSB field of the first packet symbol PSY1 includes an inverted value of a bit value of bit address "A+M+1", the MSB field of the first packet symbol PSY1 may be a field that allows a maximum run length of the first data packet PK1 to be "M" or less.

The j-th packet symbol PSYj may be a packet symbol corresponding to the j-th symbol SYj of the first bit stream BS1. The j-th packet symbol PSYj may be the last packet symbol of the first data packet PK1.

The j-th packet symbol PSYj may include (B+1)-th to (B+M)-th bits.

The LSB field of the j-th packet symbol PSYj may correspond to a bit, the bit address of which is the smallest, from among the (B+1)-th to (B+M)-th bits.

The MSB field of the j-th packet symbol PSYj may correspond to a bit, the bit address of which is the greatest, from among the (B+1)-th to (B+M)-th bits.

The address field of the j-th packet symbol PSYj may correspond to the remaining bits of the (B+1)-th to (B+M)-th bits other than the bits belonging to the LSB and MSB fields.

For example, the LSB field of the j-th packet symbol PSYj may correspond to bit address "B+1", the MSB field of the j-th packet symbol PSYj may correspond to bit addresses "B+M", and the address field of the j-th packet symbol PSYj may correspond to bit addresses "B+2:B+M−1".

The LSB field of the j-th packet symbol PSYj may include a bit value of the j-th symbol SYj. For example, in the case where a bit value of the j-th symbol SYj includes "M" bits each being "0", the LSB field of the j-th packet symbol PSYj may include "0".

The address field of the j-th packet symbol PSYj may include an end address.

The end address will be described in more detail with reference to FIG. 7A.

The MSB field of the j-th packet symbol PSYj may include an inverted value of a bit value of bit address "B+M+1". For example, in the case where a bit value of bit address "B+M+1" is "0", a bit value of the MSB field of the j-th packet symbol PSYj may be "1".

The decoder may compare a bit value of bit address "B+M+1" and a bit value of the MSB field of the j-th packet symbol PSYj to determine whether an error occurs in an operation of the encoder 111. For example, when the bit value of bit address "B+M+1" is equal to the bit value of the MSB field of the j-th packet symbol PSYj, the decoder may determine that an error occurs in an operation of the encoder 111.

For convenience of description, FIG. 4B shows the first packet symbol PSY1 and the j-th packet symbol PSYj; however, as in the above example illustrated in FIG. 4B, the encoder 111 may generate the plurality of packet symbols PSY1 to PSYj.

Figure 5:
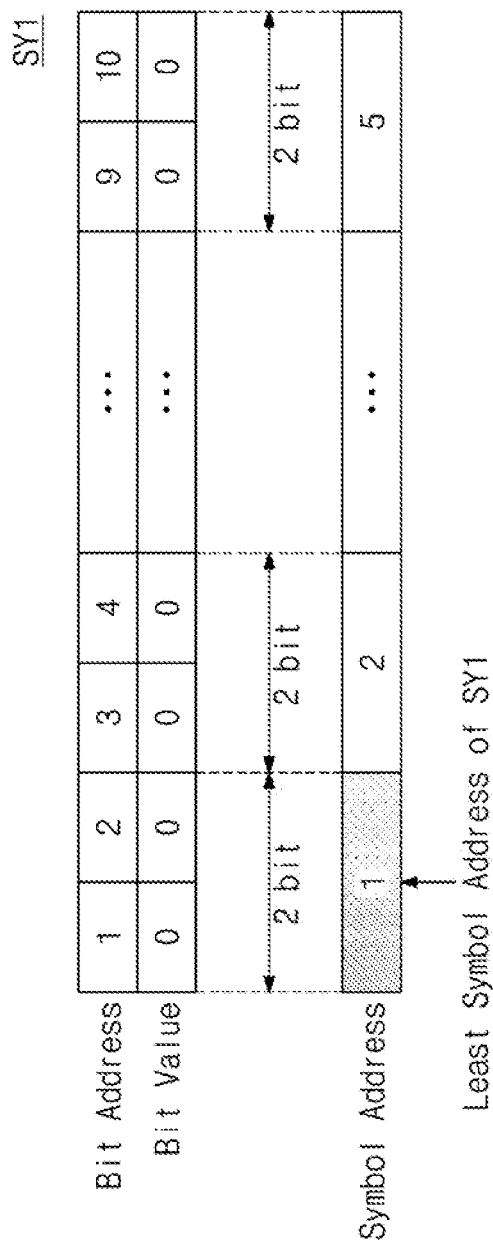
FIG. 5 is a diagram illustrating a symbol address in detail, according to an example embodiment.

FIG. 5 is a diagram illustrating a symbol address in detail, according to an example embodiment.

A symbol address of the first symbol SY1 of FIG. 3 is illustrated in FIG. 5.

With regard to the first to N-th bits of the first bit stream BS1, a value of a symbol address may increase every "K" bits. For example, with regard to the first to N-th bits, when "K" is 2, a value of a symbol address may increase every "2" bits, in which case a value of a symbol address of the first and second bits may be "1", a value of a symbol address of the third and fourth bits may be "2", and a value of a symbol address of the ninth and tenth bits may be "5".

Each of the plurality of symbols SY1 to SYj may include a plurality of symbol addresses. The first symbol SY1 may include symbol addresses, the number of which corresponds to a quotient when dividing "M" by "K". For example, in the case where the first symbol SY1 includes 10 bits and "K" is 2, a value of a symbol address of the first and second bits may be "1", a value of a symbol address of the third and fourth may be "2", a value of a symbol address of the fifth and sixth bits may be "3", a value of a symbol address of the seventh and eighth bits may be "4", and a value of a symbol address of the ninth and tenth bits may be "5". Thus, the first symbol SY1 may include 5 (i.e., 10/2) symbol addresses. In this case, a value of a least symbol address of the first symbol SY1 may be "1".

Figure 6:
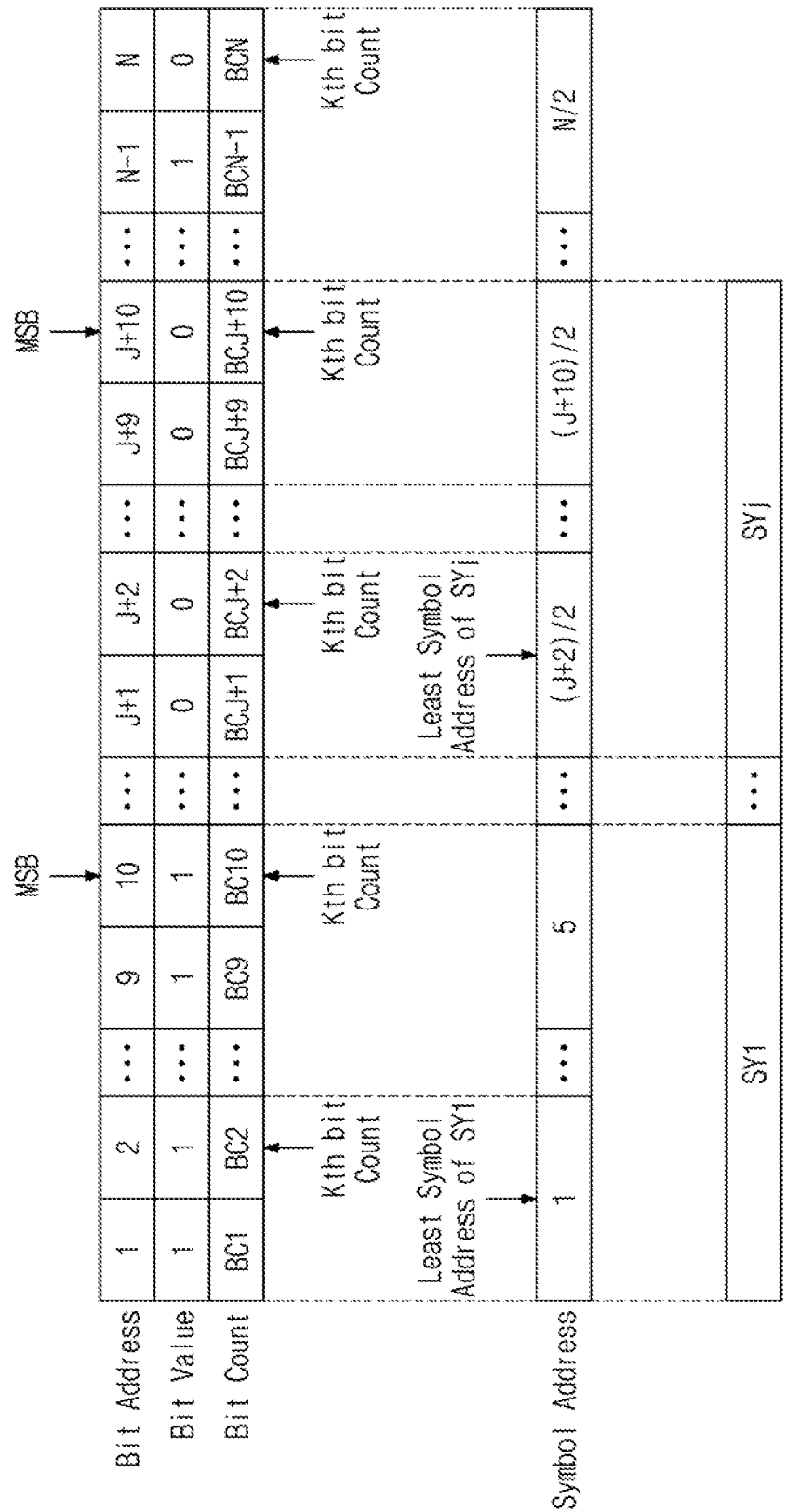
FIG. 6 is a diagram illustrating a symbol in detail, according to an example embodiment.

FIG. 6 is a diagram illustrating a symbol in detail, according to an example embodiment.

Referring to FIG. 6, an operation in which the encoder 111 of FIG. 1 determines the plurality of symbols SY1 to SYj in the first bit stream BS1 is illustrated.

The encoder 111 may generate first to N-th bit counts BC1 to BCN respectively corresponding to first to N-bit bits 1 to N of the first bit stream BS1.

The first to N-th bit counts BC1 to BCN may refer to the number of first bit values being consecutive or the number of second bit values being consecutive. For example, when a bit value of the first bit is "1", the first bit count BC1 is "1"; when a bit value of the second bit is "1", the second bit count BC2 is "2"; when a bit value of the third bit is "0", the third bit count BC3 is "1".

The first to N-th bit counts BC1 to BCN may be smaller than a sum of "M" and "2". For example, when "M" is 10 and all bit values of the second to thirteenth bits are "0", the twentieth bit count BC12 may be "11", and the thirteenth bit count BC13 may be "1". Thus, in the case where "M" is "10", a maximum bit count may be "11".

For every K-bit bit count of the first to N-th bit counts BC1 to BCN, the encoder 111 may determine whether a K-th bit count is greater than or equal to "M". For example, in the case where "K" is "2", the encoder 111 may determine whether each of even-numbered bit counts is greater than or equal to "M".

The encoder 111 may determine a symbol in which a bit corresponding to a bit count, which is determined to be greater than or equal to "M", from among the first to N-th bit counts BC1 to BCN, is set as an MSB. For example, when all bit values of the first to tenth bits are "1", the tenth bit count BC10 may be "10". When it is determined that the tenth bit count BC10 is "10", the encoder 111 may determine the first symbol SY1 in which the tenth bit is set as an MSB. The first symbol SY1 may include first to fifth symbol addresses. A value of a least symbol address of the first symbol SY1 may be "1".

For example, when it is determined that the (J+2)-th bit count BCJ+2 is "10", the encoder 111 may determine the j-th symbol SYj in which the (J+2)-th bit is set as an MSB. The j-th symbol SYj may include (J+2)/2-th to (J+10)/2-th symbol addresses. A value of a least symbol address of the j-th symbol SYj may be "(J+2)/2".

Figure 7A:
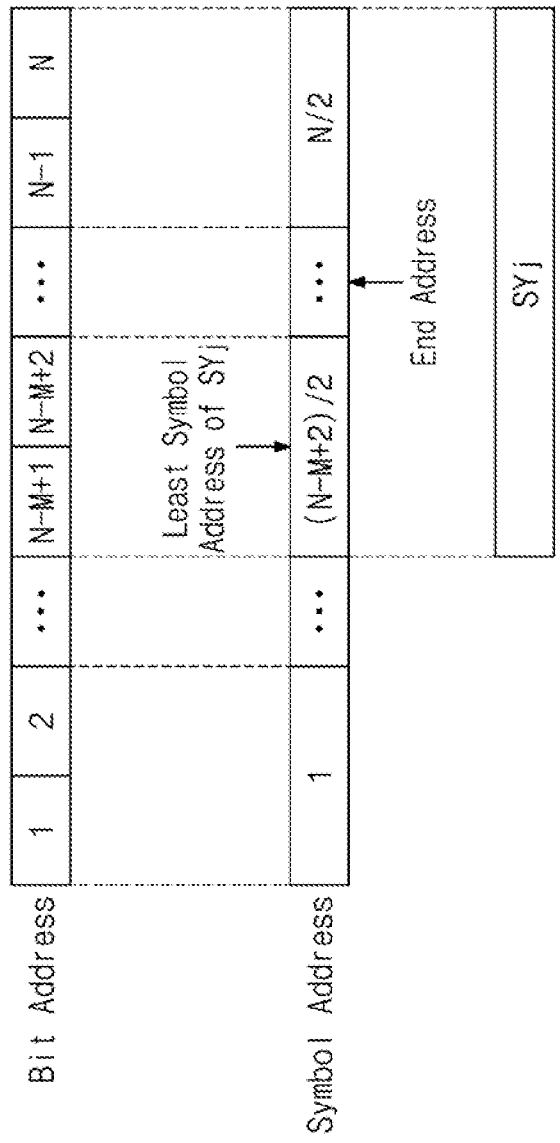
FIG. 7A is a diagram illustrating an end address in detail, according to an example embodiment.

FIG. 7A is a diagram illustrating an end address in detail, according to an example embodiment.

Referring to FIG. 7A, an end address of a bit stream including first to N-th bits is illustrated.

The end address may be a symbol address indicating an end of a data packet from among a plurality of symbol addresses. A decoder may determine a packet symbol including the end address as the last packet symbol of the data packet.

The end address may be one of addresses after a least symbol address of the last symbol SYj and before the last symbol address of a first bit stream. For example, assuming that the last symbol SYj of the first bit stream includes (N-M+1)-th to N-th bits, the end address may be one of addresses after a least symbol address of the last symbol SYj and before the last symbol address of the first bit stream. For example, assuming that "N" is "510", "K" is "2", "M" is "10", and the last symbol SYj includes 501st to 510th bits, because a value of a least symbol address of the last symbol SYj is "251" and a value of the last symbol address is "255", a value of the end address may be one of values after "251" and before "255". Thus, a value of the end address may be one of "252", "253", and "254".

Figure 7B:
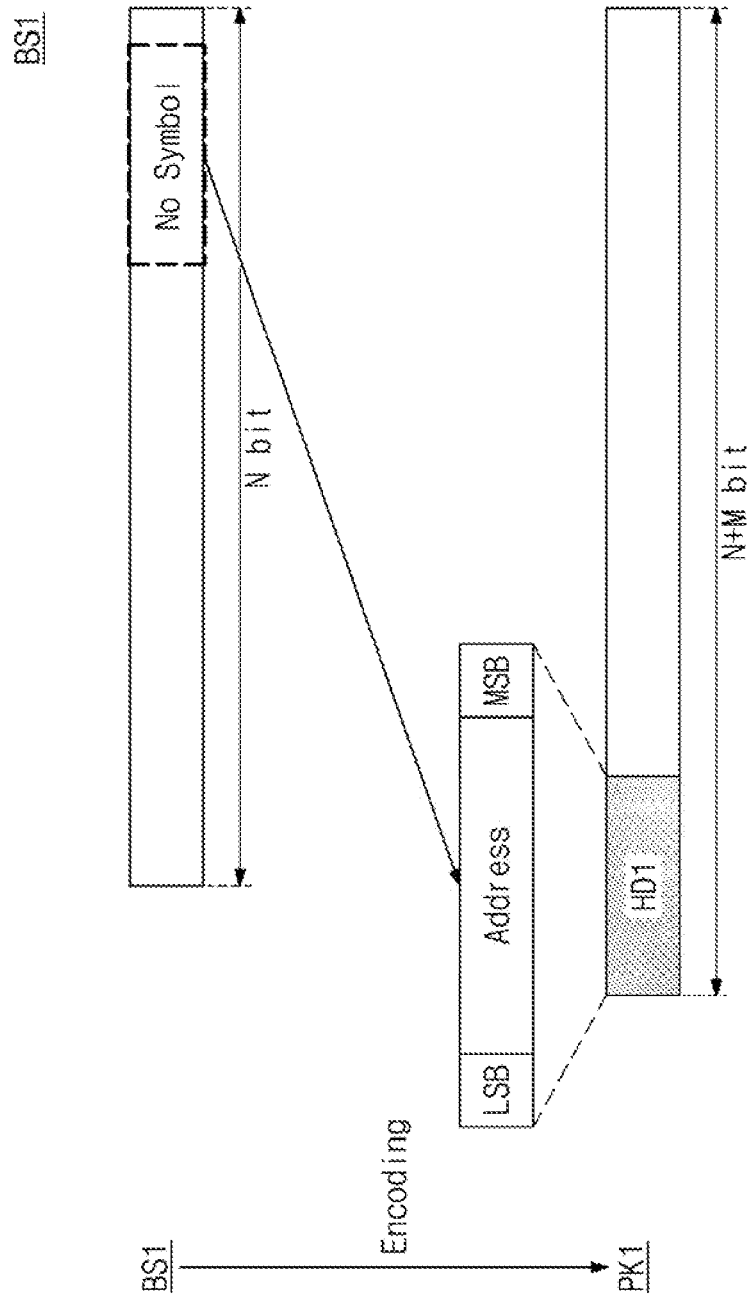
FIG. 7B is a diagram illustrating a header including an end address in detail, according to an example embodiment.

FIG. 7B is a diagram illustrating a header including an end address in detail, according to an example embodiment.

Referring to FIG. 7B, there is illustrated a first data packet that is generated based on a first bit stream in which a symbol is not included.

When a bit count, which is determined as being greater than or equal to "M", from among first to N-th bit counts does not exist (i.e., the first bit stream BS1 does not include a symbol), the address field of the first header HD1 may include an end address. For example, when a maximum run length of the first bit stream BS1 is smaller than "M", an encoder may generate a header including an end address and may not generate a packet symbol.

Thus, the case where the address field of the first header HD1 includes the end address may mean that a maximum run length of the first bit stream BS1 is smaller than "M".

Figure 8A:
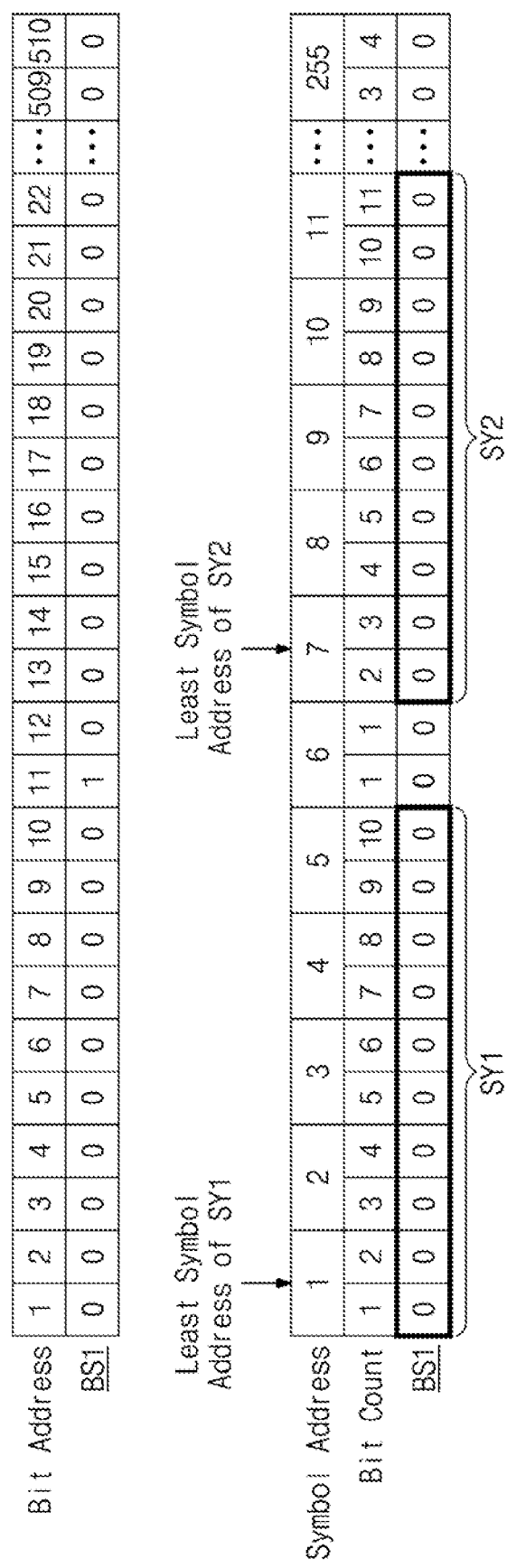
FIG. 8A is a diagram illustrating a symbol in detail, according to an example embodiment.

FIG. 8A is a diagram illustrating a symbol in detail, according to an example embodiment.

Referring to FIG. 8A, an operation in which an encoder determines the first symbol SY1 and the second symbol SY2 in the first bit stream BS1 is illustrated.

For example, in the case where "K" is "2" and "M" is "10", the encoder may determine the plurality of symbols SY1 to SYj in the first bit stream BS1 including first to $510^{th}$ bits. With regard to the first to $510^{th}$ bits of the first bit stream BS1, a value of a symbol address may increase every 2 bits (based on "K" being "2"). For example, a value of a symbol address of the first and second bits may be "1", a value of a symbol address of the third and fourth bits may be "2", a value of a symbol address of the ninth and tenth bits may be "5", and a value of the last symbol address of the first bit stream BS1 may be "255".

The encoder may generate first to $510^{th}$ bit counts respectively corresponding to the first to $510^{th}$ bits of the first bit stream BS1. For example, when all bit values of the first to ninth bits are "0", the ninth bit count may be "9", and, because all bit values of the first to tenth bits are "0", the tenth bit count may be "10".

The encoder may determine whether a bit count is greater than or equal to "10", every 2 bits. For example, the encoder may determine whether the second bit count is greater than or equal to "10", and the encoder may determine whether the tenth bit count is greater than or equal to "10".

The encoder may generate symbols in which bit counts, which are determined as being greater than or equal to "10" every 2 bits, from among the first to $510^{th}$ bit counts, are set as an MSB. For example, the encoder may generate the first symbol SY1 in which the tenth bit is set as an MSB (based on the tenth bit count being "10"). For example, the encoder may generate the second symbol SY2 in which the $22^{nd}$ bit is set as an MSB (based on the $22^{nd}$ bit count being "10").

Figure 8B:
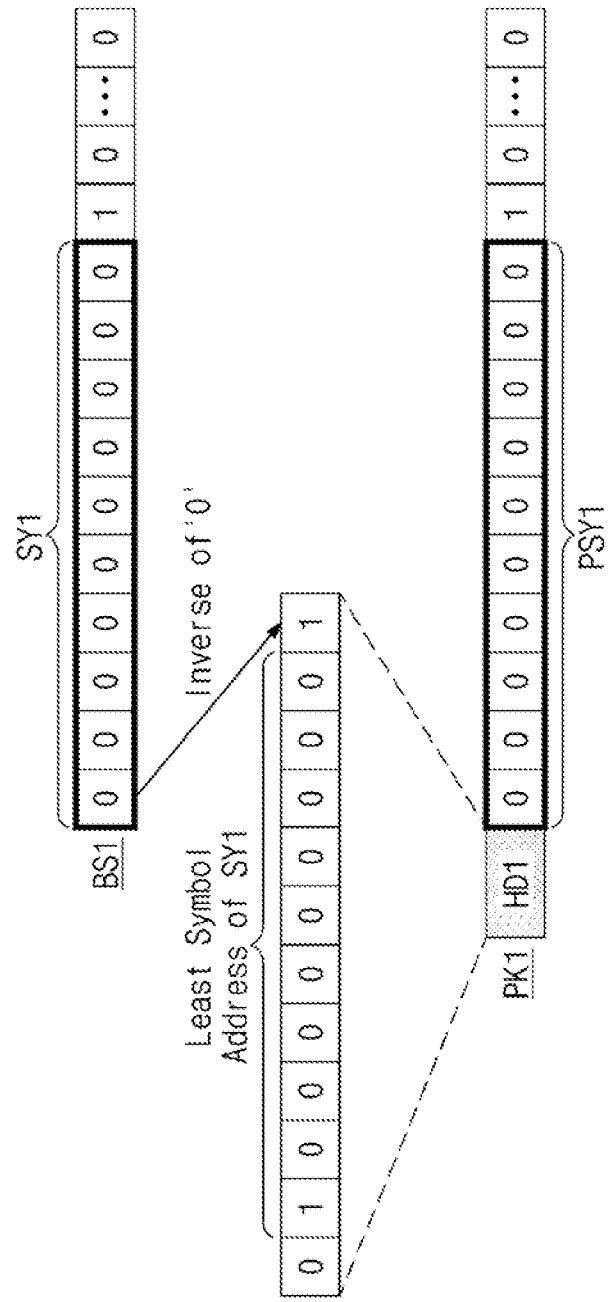
FIG. 8B is a diagram illustrating a header in detail, according to an example embodiment.

FIG. 8B is a diagram illustrating a header in detail, according to an example embodiment.

Referring to FIG. 8B, an operation in which an encoder generates a first header HD1 is illustrated. The first bit stream BS1 and the first symbol SY1 of FIG. 8B may correspond to the first bit stream BS1 and the first symbol SY1 of FIG. 8A.

The encoder may generate the first header HD1 that is located at the forefront of the first data packet PK1. The LSB field of the first header HD1 may include "0" (based on a bit value of the last bit of a previous bit stream (not illustrated) being "1"). The address field of the first header HD1 may include "1" (based on a value of a least symbol address of the first symbol SY1 being "1"). The MSB field of the first header HD1 may include "1" (based on a value of a first bit being "0").

Figure 8C:
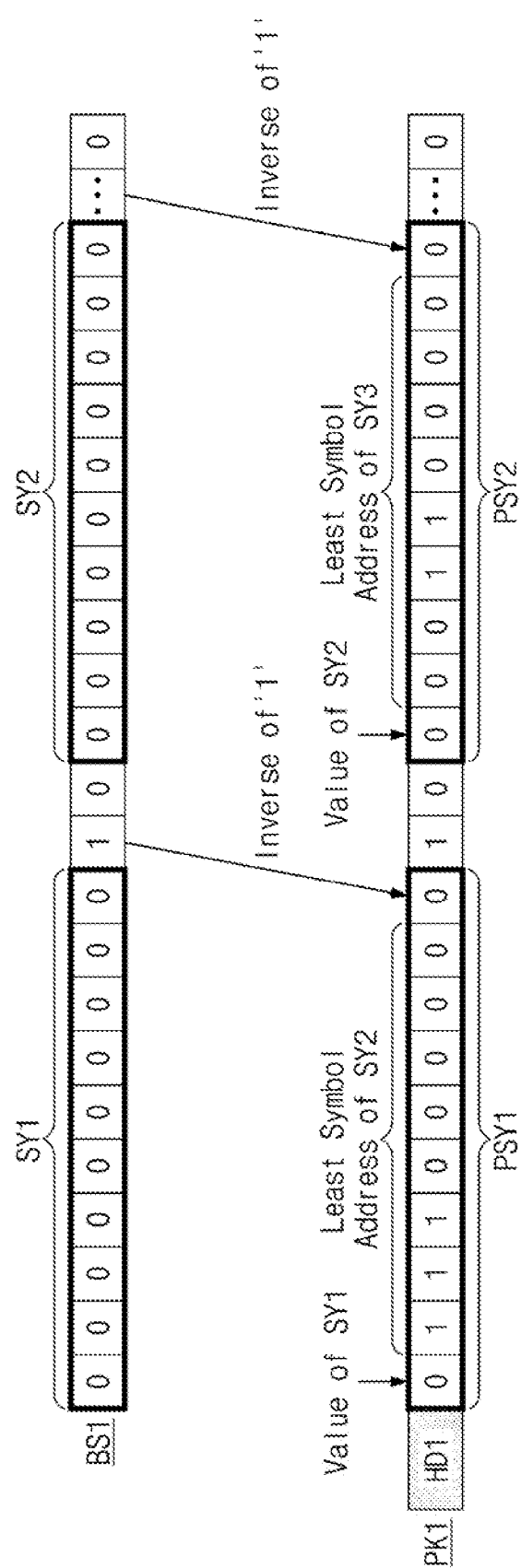
FIG. 8C is a diagram illustrating a packet symbol in detail, according to an example embodiment.

FIG. 8C is a diagram illustrating a packet symbol in detail, according to an example embodiment.

Referring to FIG. 8C, an operation in which an encoder generates the first packet symbol PSY1 and the second packet symbol PSY2 is illustrated. The first bit stream BS1, the first symbol SY1, and the second symbol SY2 of FIG. 8C may correspond to the first bit stream BS1, the first symbol SY1, and the second symbol SY2 of FIG. 8A. The first header HD1 of FIG. 8C may correspond to the first header HD1 of FIG. 8B.

The encoder may generate the first packet symbol PSY1 corresponding to the first symbol SY1. The LSB field of the first packet symbol PSY1 may include "0" (based on a bit value of the first symbol SY1 being "0"). The address field of the first packet symbol PSY1 may include "7" (based on a value of a least symbol address of the second symbol SY2 being "7"). The MSB field of the first packet symbol PSY1 may include "0" (based on a bit value of an eleventh bit being "1").

The encoder may generate the second packet symbol PSY2 corresponding to the second symbol SY2. The LSB field of the second packet symbol PSY2 may include "0" (based on a bit value of the second symbol SY2 being "0"). The address field of the second packet symbol PSY2 may include "12" (based on a value of a least symbol address of a third symbol (not illustrated) being "12"). The MSB field of the second packet symbol PSY2 may include "0" (based on a bit value of a $23^{rd}$ bit (not illustrated) being "1").

Figure 9A:
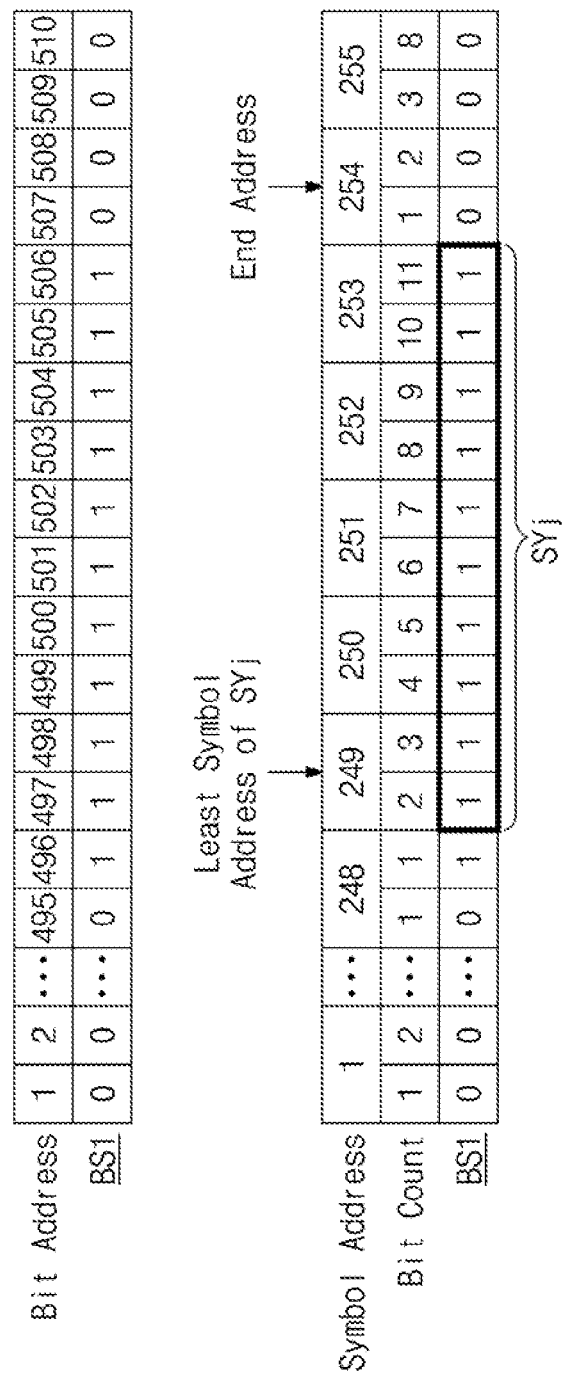
FIG. 9A is a diagram illustrating a symbol in detail, according to an example embodiment.

FIG. 9A is a diagram illustrating a symbol in detail, according to an example embodiment.

Referring to FIG. 9A, an operation in which an encoder determines the j-th symbol SYj in the first bit stream BS1 is illustrated. The first bit stream BS1 of FIG. 9A may correspond to the first bit stream BS1 of FIG. 8A.

In the case where "K" is "2" and "M" is "10", the encoder may determine the plurality of symbols SY1 to SYj in the first bit stream BS1 including first to $510^{th}$ bits. With regard to the first to $510^{th}$ bits of the first bit stream BS1, a value of a symbol address may increase every 2 bits (based on "K" being "2"). A value of a symbol address of the first and second bits may be "1". A value of a symbol address of the $495^{th}$ and $496^{th}$ bits may be "248". A value of a symbol address of the $497^{th}$ and $498^{th}$ bits may be "249". A value of the last symbol address of the first bit stream BS1 may be "255".

Assuming that the last symbol includes $501^{st}$ to $510^{th}$ bits, because a value of a least symbol address of the last symbol is "251" and a value of the last symbol address is "255", a value of the end address may be one of "252", "253", and "254".

The encoder may generate first to $510^{th}$ bit counts respectively corresponding to the first to $510^{th}$ bits of the first bit stream BS1. The encoder may generate symbols in which bit counts, which are determined as being greater than or equal to "10" every 2 bits, from among the first to 510th bit counts, are set as an MSB. For example, the encoder may generate the j-th symbol SYj in which the $506^{th}$ bit is set as an MSB (based on the $506^{th}$ bit count being "11").

Figure 9B:
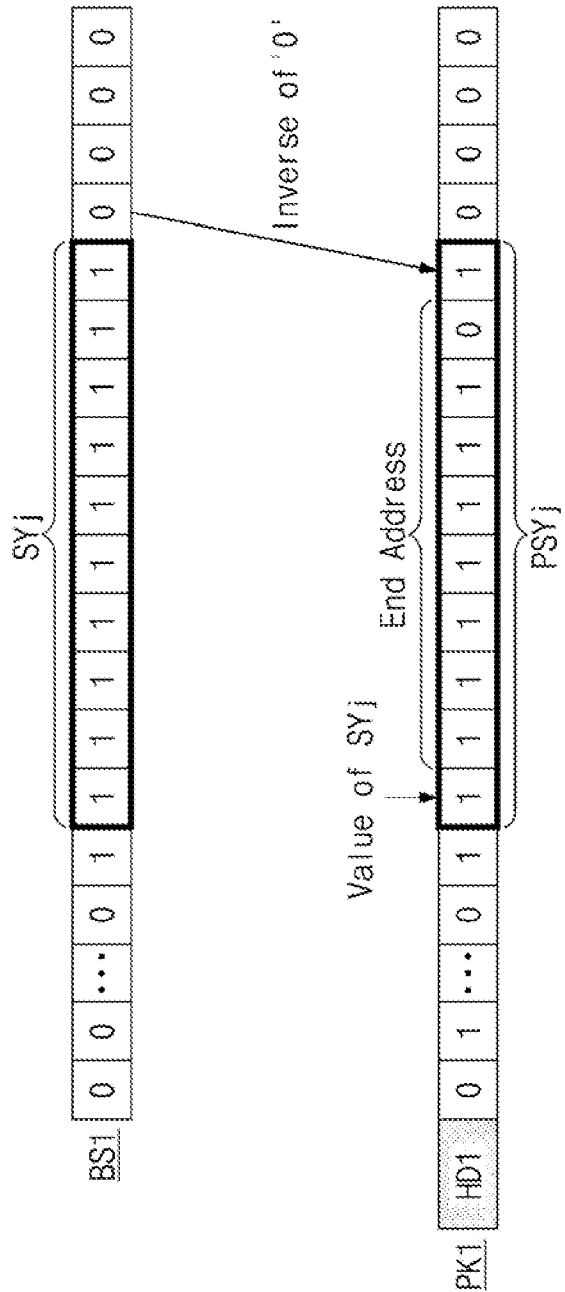
FIG. 9B is a diagram illustrating a packet symbol in detail, according to an example embodiment.

FIG. 9B is a diagram illustrating a packet symbol in detail, according to an example embodiment.

Referring to FIG. 9B, an operation in which an encoder generates a j-th packet symbol from the j-th symbol SYj is illustrated. The first bit stream BS1 of FIG. 9B may correspond to the first bit stream BS1 of FIG. 9A.

The LSB field of the j-th packet symbol PSYj may include "1" (based on a bit value of the j-th symbol SYj being "1"). The address field of the j-th packet symbol PSYj may include an end address of "254" (based on the j-th symbol SYj being the last symbol of the first bit stream BS1). The MSB field of the j-th packet symbol PSYj may include "1" (based on a bit value of a $507^{th}$ bit being "0").

Figure 10:
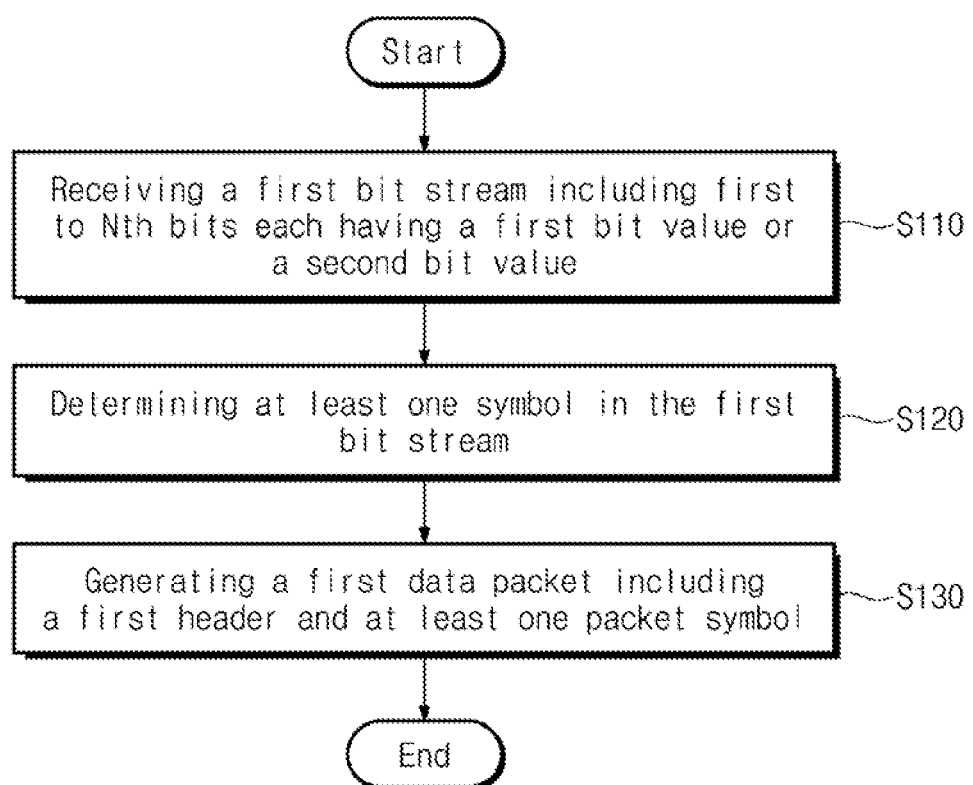
FIG. 10 is a flowchart illustrating an example of an operation of an encoder, according to an example embodiment.

FIG. 10 is a flowchart illustrating an example of an operation of an encoder, according to an example embodiment.

An operating method of the encoder 111 of FIG. 1 is illustrated in FIG. 10.

In operation S110, the encoder 111 may receive a bit stream including first to N-th bits each having a first bit value or a second bit value. For example, the first bit value may be "0", and the second bit value may be "1". The bit stream may include first to $510^{th}$ bits, although it will be understood that "N" may be increased or decreased.

In operation S120, the encoder 111 may determine at least one symbol in the bit stream.

A symbol may refer to "M" consecutive bits each having the first bit value or the second bit value. For example, in the case where "M" is "10" and all bit values of first to tenth bits of the first bit stream BS1 are "0", the encoder 111 may determine the first to tenth bits as one symbol. Thus, the encoder 111 may perform encoding such that a maximum run length of the first bit stream BS1 is smaller than "M" or is equal to "M", although it will be understood that "M" may be increased or decreased.

How the encoder 111 determines a symbol in a bit stream will be described in more detail with reference to FIG. 11.

In operation S130, the encoder 111 may generate a data packet including a header and at least one packet symbol, based on the bit stream.

By replacing a symbol of the bit stream with a packet symbol, the encoder 111 may perform encoding such that a maximum run length of the data packet is M or less.

The header may include an LSB field, an address field, and an MSB field. The LSB field and the MSB field of the header may be fields that allow a maximum run length of a data packet PK to be "M" or less.

A packet symbol may include "M" bits each having the first bit value or the second bit value. The packet symbol may include an LSB field, an address field, and an MSB field.

Figure 11:
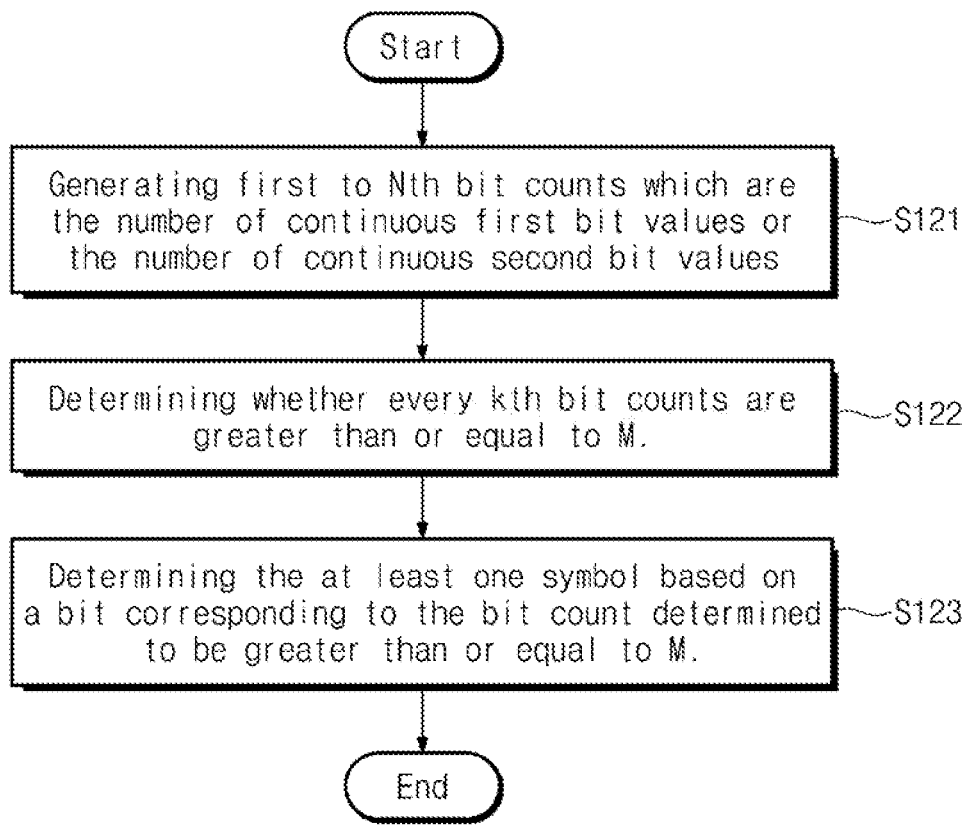
FIG. 11 is a flowchart illustrating an example of an operation of an encoder of FIG. 10, according to an example embodiment.

FIG. 11 is a flowchart illustrating an example of an operation of an encoder of FIG. 2, according to an example embodiment.

An operation in which an encoder determines a symbol in a bit stream is illustrated in FIG. 11. The flowchart of FIG. 11 illustrates operation S120 of the flowchart of FIG. 10 in detail.

In operation S121, the encoder 111 may generate first to N-th bit counts respectively corresponding to first to N-th bits of a bit stream BS. Each of the first to N-th bit counts may indicate the number of first bit values being consecutive or the number of second bit values being consecutive. For example, when a bit value of the first bit is "1", the first bit count may be "1"; when a bit value of the second bit is "1", the second bit count may be "2".

The first to N-th bit counts may be smaller than a sum of "M" and "2". For example, when "M" is 10 and all bit values of the second to thirteenth bits are "0", the twentieth bit count BC12 may be "11", and the thirteenth bit count BC13 may be "1".

In operation S122, every K-th bit count of the first to N-th bit counts, the encoder 111 may determine whether the K-bit bit count is greater than or equal to "M". For example, when "K" is "2", the encoder 111 may determine whether each of even-numbered bit counts is greater than or equal to "M".

In operation S123, the encoder 111 may determine a symbol in which a bit corresponding to a bit count, which is determined to be greater than or equal to "M", from among the first to N-th bit counts, is set as an MSB. For example, when all bit values of the first to tenth bits are "1", the tenth bit count may be "10". When it is determined that the tenth bit count is "10", the encoder 111 may determine a first symbol in which the tenth bit is set as an MSB.

FIG. 12 is a diagram illustrating an operating method of an electronic device, according to an example embodiment.

An operating method of the electronic device 200 of FIG. 2 is illustrated in FIG. 12. The control circuit 230 may correspond to the control circuit 230 of FIG. 2. The transmitter 210 may correspond to the transmitter 210 of FIG. 2. The receiver 220 may correspond to the receiver 220 of FIG. 2.

In operation S210, the control circuit 230 may generate a bit stream. The bit stream may include first to N-th bits each having a first bit value or a second bit value. In operation S211, the control circuit 230 may send the bit stream to the transmitter 210.

In operation S220, the transmitter 210 may determine at least one symbol of the bit stream.

A symbol may refer to "M" consecutive bits each having the first bit value or the second bit value.

In operation S230, the transmitter 210 may generate a data packet including a header and at least one packet symbol. By replacing a symbol of the bit stream with a packet symbol, the transmitter 210 may perform encoding such that a maximum run length of the data packet is M or less.

In operation S231, the transmitter 210 may send the data packet to the receiver 220.

In operation S240, the receiver 220 may process the data packet. The receiver 220 may generate the bit stream from the data packet. The receiver 220 may recover a clock from the data packet. When a maximum run length of the data packet is greater than "M", the receiver 220 may determine that an error occurs in an operation of the transmitter 210.

As set forth above, according to an example embodiment, an encoder is provided that may set a maximum run length of data to an arbitrary length, and may minimize an overhead of an encoding operation. Example embodiments may provide an encoder generating a data packet, an operating method of the encoder, and an operating method of an electronic device including the encoder.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electronic device, comprising:
a control circuit configured to receive a first bit stream including first to N-th bits each having a first bit value or second bit value; and
a transmitter configured to determine at least one symbol in the first bit stream, and to generate a first data packet including a first header and at least one packet symbol corresponding to the at least one symbol, based on the at least one symbol in the first stream, wherein:
the at least one symbol includes "M" consecutive ones of the first bit values or the second bit values,
the first header includes a least symbol address of a first symbol of the at least one symbol and an inverted value of a bit value of a first bit of the first symbol,
the at least one packet symbol includes a bit value of the at least one symbol, a least symbol address of a second symbol of the at least one symbol, and an inverted value of a bit value of a next bit of the first symbol, and
"N" is a natural number, and "M" is a natural number smaller than "N".

2. The electronic device of claim 1, wherein:
the control circuit is further configured to receive a second bit stream including (N+1)-th to 2N-th bits each having the first bit value or the second bit value; and
the transmitter is further configured to determine at least one symbol of the second bit stream, and to generate a second data packet including a second header and at least one packet symbol corresponding to the at least one symbol of the second bit stream, based on the at least one symbol in the second bit stream, wherein:
the at least one symbol in the second bit stream includes "M" consecutive ones of the first bit values or the second bit values,
the second header includes a least symbol address of a first symbol of the at least one symbol of the second bit stream and an inverted value of the (N+1)-th bit of the first symbol of the at least one symbol of the second bit stream,
the at least one packet symbol in the second packet data includes a bit value of the first symbol in the second bit stream, a least symbol address of a second symbol of the at least one symbol in the second bit stream, and an inverted value of a bit value of a next bit of the first symbol in the second bit stream.

3. The electronic device of claim 1, wherein
the transmitter is further configured to generate first to N-th bit counts respectively corresponding to the first to N-th bits, and determine the at least one symbol, based on the first to N-th bit counts in the first bit stream,
wherein each of the first to N-th bit counts indicates the number of first bit values being consecutive or the number of second bit values being consecutive and is smaller than a sum of "M" and "2".

4. The electronic device of claim 1, wherein a last packet symbol of the at least one packet symbol, which corresponds to a last symbol of the at least one symbol, includes a bit value of the last symbol, an end address, and an inverted value of a bit value of a next bit of the last symbol.

5. The electronic device of claim 1, wherein a value of a least significant bit of a first packet symbol of the at least one packet symbol is a bit value of a first symbol, and a value of a most significant bit of the first packet symbol is the inverted value of the bit value of the next bit of the first symbol.

6. The electronic device of claim 2, wherein the second header further includes an inverted value of a bit value of the N-th bit of the first bit stream.

7. An electronic device, comprising:
a transmitter configured to generate a first data packet including a first header and at least one packet symbol from a first bit stream, wherein the first bit stream includes first to N-th bits each having a first bit value and a second bit value; and
a receiver configured to:
receive the first data packet,
determine at least one symbol corresponding to the first header and the at least one packet symbol, based on the first header and the at least one packet symbol, wherein the at least one symbol includes "M" consecutive bits each having the first bit value or the second bit value, and
generate the first bit stream based on the at least one symbol, wherein:
the first header includes a least symbol address of a first symbol of the at least one symbol and an inverted value of a bit value of the first bit of the first symbol,
a first packet symbol of the at least one packet symbol includes a bit value of the first symbol, a least symbol address of a second symbol of the at least one symbol, and an inverted value of a bit value of a next bit of the first symbol, and
"N" is a natural number, and "M" is a natural number smaller than "N".

8. The electronic device of claim 7, wherein
the receiver is further configured to generate a second data packet including a second header and at least one packet symbol from a second bit stream, wherein the second bit stream includes (N+1)-th to 2N-th bits each having the first bit value or the second bit value; and
the receiver is further configured to:
receive the second data packet,
determine at least one symbol of the second bit stream corresponding to the second header and the at least one packet symbol in the second data packet, wherein the at least one symbol of the second bit stream includes "M" consecutive bits each having the first bit value or the second bit value, and
generate the second bit stream based on the at least one symbol of the second bit stream, wherein:
the second header includes a least symbol address of a first symbol of the at least one symbol of the second bit stream and an inverted value of a bit value of the (N+1)-th bit of the second bit stream, and
a first packet symbol of the at least one packet symbol of the second data packet includes a bit value of the first symbol of the second bit stream, a least symbol address of a second symbol of the at least one symbol of the second bit stream, and an inverted value of a bit value of a next bit of the first symbol of the second bit stream.

9. The electronic device of claim 7, wherein the receiver further configured to send the generated the first bit stream to a display panel, wherein the display panel is configured to output the first bit stream.

10. The electronic device of claim 7, wherein:
the receiver is further configured to determine an error occurred in an encoding operation based on a result of comparing a bit value of a last bit address of a previous data packet of the first data packet and a bit value of a least significant bit (LSB) field in the first header.

11. The electronic device of claim 7, wherein:
the receiver is further configured to determine an error occurred in an encoding operation based on a result of comparing a bit value of most significant bit (MSB) field in the first header and a bit value of a field next to the MSB field in the first header.

12. The electronic device of claim 7, wherein:
the receiver is further configured to determine an error occurred in an encoding operation based on a result of comparing a bit value of a MSB field of a first packet symbol of the at least one packet symbol, and a bit value of a field next to the MSB field of the first packet symbol of the at least one packet symbol.

13. The electronic device of claim 7, wherein:
the receiver is further configured to determine a packet symbol including an end address in the at least one packet as a last packet symbol of the first data packet.

14. The electronic device of claim 7, wherein:
a value of a least significant bit of the first packet symbol is a bit value of the first symbol, and
a value of a most significant bit of the first packet symbol is the inverted value of the bit value of the next bit of the first symbol.

15. The electronic device of claim 7, wherein:
a size of the first bit stream corresponds to "N", and
a size of the first data packet corresponds to a sum of "N" and "M".

16. The electronic device of claim 8, wherein the receiver is further configured to determine that an error occurs in an encoding operation when a maximum run length of the first data packet and the second data packet is greater than "M".

17. The electronic device of claim 8, wherein the second header further includes an inverted value of a bit value of the N-th bit of the first bit stream.

18. An operating method of a decoder, the method comprising:
receiving a first data packet including a first header and at least one packet symbol;
determining at least one symbol corresponding the first header and the at least one packet symbol, based on the first header and the at least one packet symbol, wherein the at least one symbol includes "M" consecutive bits each having a first bit value or a second bit value; and
generating the first bit stream including the at least one symbol, wherein the first bit stream includes first to N-th bits each having a first bit value or a second bit value, wherein:
the first header includes a least symbol address of a first symbol of the at least one symbol and an inverted value of a bit value of the first bit of the first symbol,
a first packet symbol of the at least one packet symbol includes a bit value of the first symbol, a least symbol address of a second symbol of the at least one symbol, and an inverted value of a bit value of a next bit of the first symbol, and "N" is a natural number, and "M" is a natural number smaller than "N".

19. The method of claim 18, wherein a last packet symbol of the at least one packet symbol, which corresponds to a last symbol of the at least one symbol, includes a bit value of the last symbol, an end address, and an inverted value of a bit value of a next bit of the last symbol.

20. The method of claim 18, wherein:
a value of a least significant bit of the first packet symbol is a bit value of the first symbol, and
a value of a most significant bit of the first packet symbol is the inverted value of the bit value of the next bit of the first symbol.

\* \* \* \* \*